US007262604B2

(12) United States Patent
Puttkammer

(10) Patent No.: US 7,262,604 B2
(45) Date of Patent: *Aug. 28, 2007

(54) METHOD OF TESTING DOCUMENTS PROVIDED WITH OPTICO-DIFFRACTIVELY EFFECTIVE MARKINGS

(75) Inventor: Frank Puttkammer, Coswig (DE)

(73) Assignee: WHD Electronische Prueftechnik, Dresden (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/431,704

(22) Filed: May 11, 2006

(65) Prior Publication Data

US 2006/0214669 A1 Sep. 28, 2006

Related U.S. Application Data

(63) Continuation of application No. 09/931,694, filed on Aug. 16, 2001, now Pat. No. 7,129,709, which is a continuation-in-part of application No. 09/423,274, filed as application No. PCT/DE98/01182 on Apr. 24, 1998, now abandoned.

(30) Foreign Application Priority Data

Apr. 25, 1997 (DE) ................................ 197 18 916

(51) Int. Cl.
*G01R 31/08* (2006.01)
*G06K 7/08* (2006.01)

(52) U.S. Cl. ...................................... 324/519; 235/451

(58) Field of Classification Search ................ 324/519; 235/451

See application file for complete search history.

(56) References Cited

U.S. PATENT DOCUMENTS 3,485,358 A 12/1969 Hooker
3,530,281 A 9/1970 Smeiman
3,800,155 A 3/1974 Potenza
4,114,032 A 9/1978 Brosow et al.
4,211,918 A 7/1980 Nyfeler
4,255,652 A 3/1981 Weber
4,355,300 A 10/1982 Weber
4,568,141 A 2/1986 Antes
4,897,300 A 1/1990 Boehm
4,913,504 A 4/1990 Gallagher
4,933,120 A 6/1990 D'Amato et al.
4,941,687 A 7/1990 Crane
4,984,824 A 1/1991 Antes et al.
5,003,915 A 4/1991 D'Amato et al.
5,093,184 A 3/1992 Edwards (Continued)

FOREIGN PATENT DOCUMENTS

EP 0 097 570 9/1987

(Continued)

*Primary Examiner*—Walter Benson
*Assistant Examiner*—Timothy J Dole
(74) *Attorney, Agent, or Firm*—Neifeld IP Law, PC

(57) ABSTRACT

The invention relates to a method of examining the authenticity of a document provided with an optico-diffractively effective element or hologram by subjecting the hologram to capacitive coupling of a voltage and deriving a signal representative of the voltage for comparison with a reference signal representative of a hologram of an authentic document.

Figure 1:
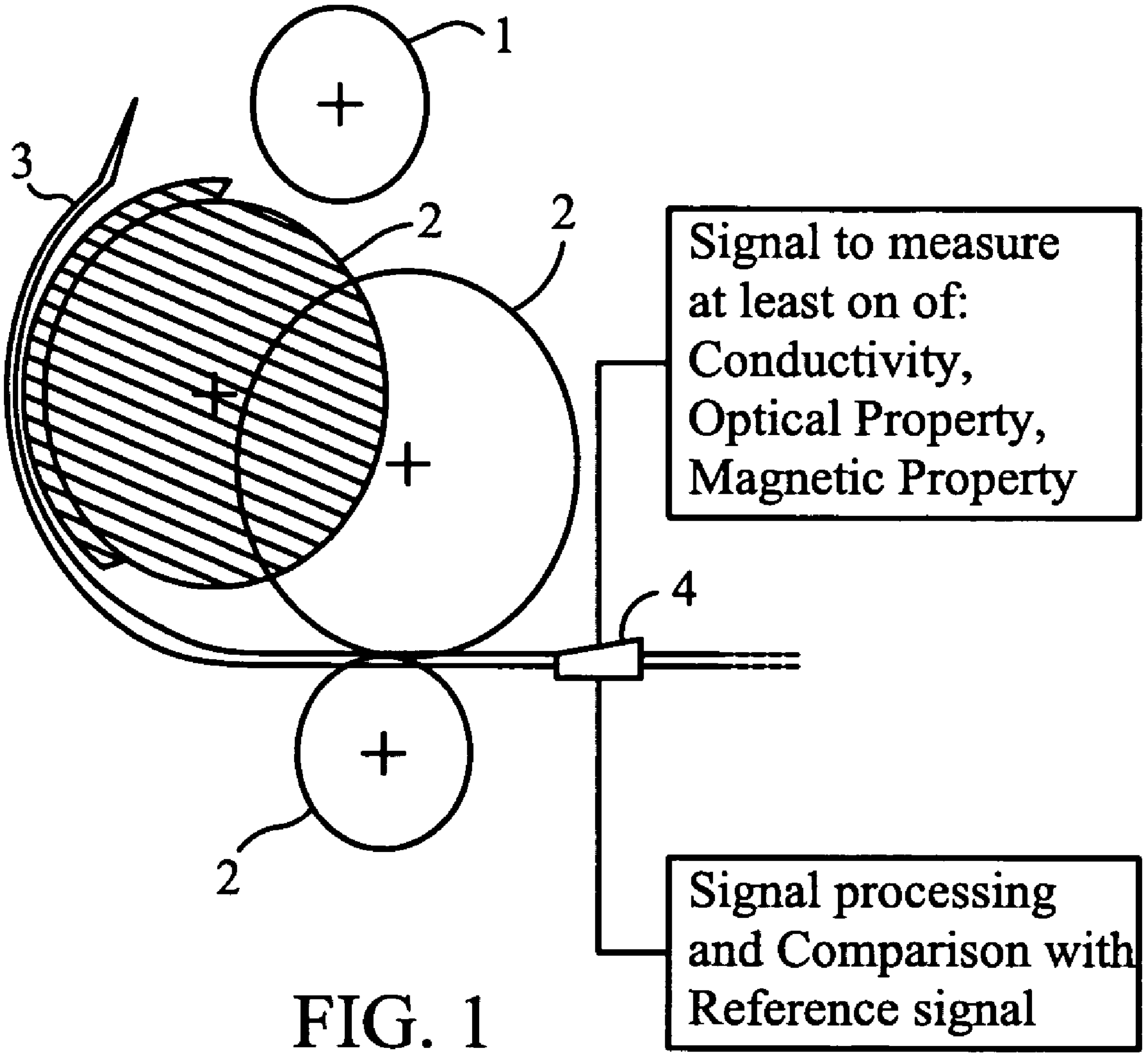

The method may be improved by providing, between individual segments of the hologram, additional security indicia providing a signal in response to being irradiated by electromagnetic radiation of a predetermined frequency.

2 Claims, 2 Drawing Sheets

U.S. PATENT DOCUMENTS 5,388,862 A 2/1995 Edwards
5,403,040 A 4/1995 Mowry, Jr. et al.
6,133,742 A 10/2000 Bridges et al.
6,165,592 A 12/2000 Berger et al.

FOREIGN PATENT DOCUMENTS

EP 0 338 378 10/1998

METHOD OF TESTING DOCUMENTS PROVIDED WITH OPTICO-DIFFRACTIVELY EFFECTIVE MARKINGS

CROSS REFERENCE TO RELATED APPLICATIONS

The present application is a continuation of and claims priority to U.S. patent application Ser. No. 09/931,694 filed Aug. 16, 2001 now U.S. Pat. No. 7,129,709, which is continuation-in-part (CIP) of U.S. patent application Ser. No. 09/423,274 filed on Jan. 27, 2000, now abandoned, which is a U.S. national stage entry of PCT/DE98/01182 filed Apr. 24, 1998, which claims priority to DE 19718916.4 filed Apr. 25, 1997, the disclosure of Ser. No. 09/931,694 is incorporated herein by reference.

BACKGROUND OF THE INVENTION

1. Field of the Invention

The invention, in general, relates to a method of examining the authenticity of documents and, more particularly, to a method of examining the authenticity of documents provided with optico-diffractively effective markings.

2. The Prior Art

Complex and elaborate devices have hitherto been required for examining documents such as, for instance, bank notes, stock certificates and other securities provided with optico-diffractive indicia or markings, hereinafter sometimes referred to as holograms, for their authenticity. Such examining devices are not only complex; they also depend, for their proper functioning, upon great precision or close tolerances for aligning the documents relative to sensors. This, in turn and by necessity, mitigates against rapid examining and, accordingly, has prevented the incorporation of such equipment in high speed processing machines. More specifically, it has not been possible to examine the authenticity of bank notes provided with holograms in high-speed bank note counting machines as such machines typically operate at rates in excess of 1,500 note per minute.

German patent application 27 47 156 discloses a method and a testing apparatus for testing the authenticity of identity cards provided with holographically encrypted security indicia. The hologram is reproduced for performing a visual examination. Obviously, such a device is not suitable for rapid and efficient examinations independently of a person.

European patent specification 0,042,946 discloses an apparatus for generating scanning patterns for testing by a system including a laser, reflector and lens as well as a photo detector or sensor. This apparatus, too, is expensive and its adaptation for examining unsorted documents would be even more expensive, for it would require a multiple cascading arrangement of the testing system.

U.S. Pat. No. 4,255,652 teaches an electrically responsive indicia detecting apparatus in which at a first position an electrical charge is capacitively induced onto the detection indicia of a document moving to a second position. During such movement the induced charge leaks and the amount of leakage is measured at the second position to generate a signal for use in determining the manner of further processing of the document. Such a system is believed not to yield sufficiently reliable signals in view of the fact that the amount of charge leakage is a function of the quality of the indicia.

OBJECTS OF THE INVENTION

It is an object of the invention to overcome the disadvantages of prior art systems by making possible high-speed authenticity check of documents by comparatively simple devices.

A more specific object of the invention is to make use of optico-diffractive indicia on security documents for examining their authenticity at high speed.

A further object of the invention is to provide a novel method of checking the authenticity of unsorted security documents.

Still further, it is an object of the invention to provide a method of the kind referred to which may be practices in hand-held devices as well as in document testing and money processing machines.

Other object of the invention will in part be obvious and will in part appear hereinafter.

BRIEF SUMMARY OF THE INVENTION

In the accomplishment of these and other objects, the invention, in a currently preferred embodiment, provides for a system of capacitive coupling between a transmitter and a receiver for measuring and evaluating the pattern of electrical conductivity of optico-diffractive indicia provided by discontinuous or partial metallization layers on, or by zones of metallized layers in different planes of, a security document.

The use of holograms and other optico-diffractively effective indicia for ensuring the authenticity of documents in general and of bank notes in particular and for preventing counterfeiting is becoming ever more prevalent. The ability reliably to test such documents at high speeds represents a further security step in the evaluation of optico-diffractively effective indicia. Such optico-diffractively effective indicia or holograms usually consist of a metallized layer integrated into documents. In addition to being optically readable, such metallized layers are electrically conductive, the conductivity varying as a function of the thickness of the layer. An optico-diffractively effective layer may be any one or a combination of a discontinuous metallization layer, a partially metallized layer or zones of metallized layers in different planes. Different measuring systems for detecting electrical conductivity have become known. Contact-less capacitive coupling has been found to be particularly useful. In the context of testing security documents for their authenticity, capacitive coupling and the transmission of energy between a transmitter and a receiver are accomplished by bridging an electromagnetic field through electrically conductive security materials or elements. Evaluation electronics at the output of the receiver compare the image of the signal obtained against appropriate reference signals. The comparison results in a classifying signal for controlling the further operation of the testing device, i.e. operation of the testing device could, for instance, continue in case of a genuine document, or the operation could either be interrupted for removal or “double-checking” of a document detected as a counterfeit or the forgery could automatically be diverted from the feed path of genuine documents. The image of the signal depends upon the structure of the metallization of the hologram or optico-diffractively effective layer. In the case of a hologram consisting of a discontinuous metallization a plurality of its segments will be of different or at least of characteristic electrical conductivity. These different conductivities have in practice been shown to affect the image of the signal.

A further improvement of the authenticity check is derived from testing the electrical conductivity in combination with other authenticity characteristics of an optico-diffractive layer or hologram. By incorporating additional authenticity characteristics in non-metallized segments of discontinuous metallization layers, the characteristics may be tested substantially at the same time as the electrical conductivity. Such additional authenticity characteristics may also be incorporated in partially metallized layers or in zones of metallized layers provided in different planes. In the case of such a compound hologram, appropriate circuitry would combines the signal derived from measuring the electrical conductivity with the signal representative of the other authenticity characteristic, and deliver an output signal representative of the hologram. The additional authenticity characteristics may be fluorescent, phosphorescent or light absorbing or transmitting properties, or they may differ from their surroundings by magnetic properties. Hence, the input of the evaluation circuitry may, in addition to the conductivity sensor, be derived from optical and/or magnetic sensors. In order to reduce detection and measurement errors the sensors are preferably mounted closely adjacent each other and in defined positions on a single support to minimize spaces between the sensors. In order further to reduce error signals, the sensor support is mounted in close proximity of the evaluation circuitry. The entire testing device is preferably mounted within a document processing machine, for instance a bank note counting machine, thereby eliminating the need for additional feed or transport devices.

DESCRIPTION OF THE SEVERAL DRAWINGS

Figure 2A:
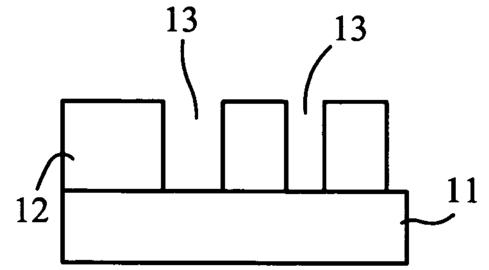
Figure 2B:
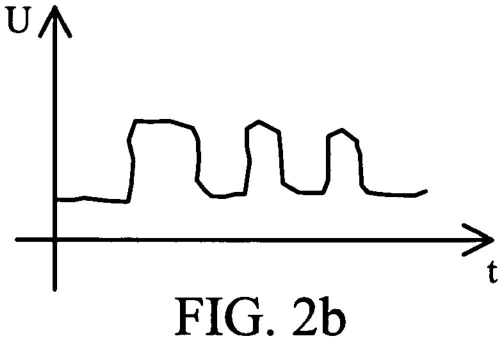

The novel features which are considered to be characteristic of the invention are set forth with particularity in the appended claims. The invention itself, however, in respect of its structure, construction and lay-out as well as manufacturing techniques, together with other objects and advantages thereof, will be best understood from the following description of preferred embodiments when read in connection with the appended drawings, in which:

FIG. 1 is schematic sectional view of a processing machine including a test device in accordance with the invention;

FIG. 2*a* is a schematic sectional view of a hologram with demetallized segments;

FIG. 2*b* is a voltage-time diagram of an evaluation signal derived from the hologram of FIG. 2*a;*

Figure 3A:
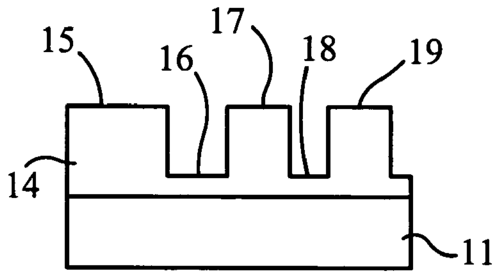
Figure 3B:
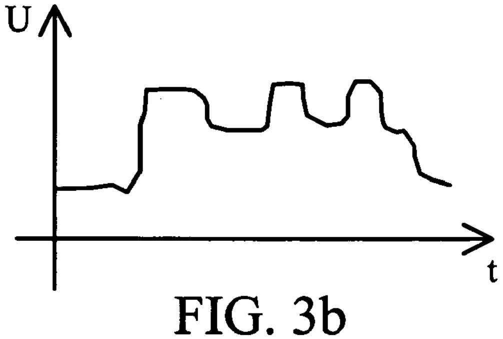

FIG. 3*a* is a schematic sectional view of a hologram with a discontinuous metallization layer;

FIG. 3*b* is a voltage time diagram of an evaluation signal derived from the hologram of FIG. 3*a;*

Figure 4A:
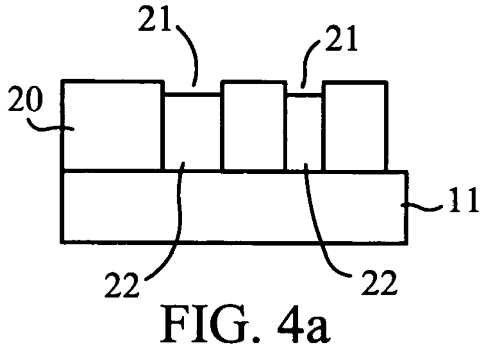
Figure 4B:
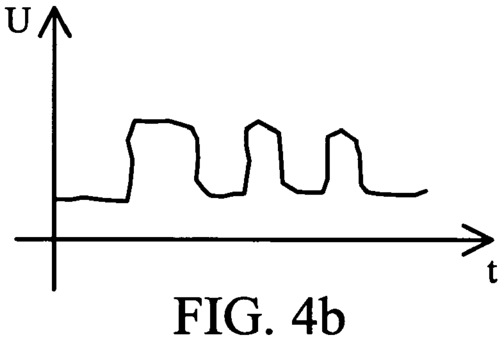
Figure 4C:
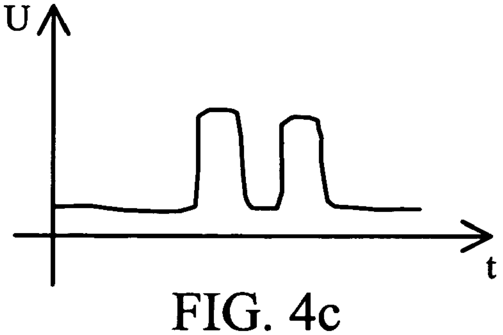

FIG. 4*a* is a schematic sectional view of a hologram provided with ultra violet authenticity indicia;

FIG. 4*b* is a voltage-time diagram of a signal representative of the electrical conductivity derived from the hologram of FIG. 4*a;* and FIG. 4*c* is a voltage-time diagram of a signal representative of the UV characteristics of the hologram of FIG. 4*a*.

DETAILED DESCRIPTION OF THE PREFERRED EMBODIMENTS

In accordance with the invention suitable sensors are mounted at appropriate positions in a document processing machine such as, for instance, a bank note counting machine. Such machines are well-known and need not be described. For examining a bank note (which may be one of a stack of bank notes of identical or different denominations), hereinafter sometimes referred to as "document", it or the entire stack is placed on a feed tray of the machine whence they are individually drawn into the machine. Regardless of the disposition of the document when moving through the machine, the sensors for detecting the electrical conductivity are structured such that they survey the document across its entire width. Optical or mechanical sensors are provided to detect the presence of a document and to generate a reference signal for the time control of a testing device 4. At the same time, the transmitting and receiving electrodes and other sensors, if any, for testing the authenticity of the hologram are activated or energized. The position of the hologram on the document is determined by recording the entire time window between leading and trailing edges of the document.

FIG. 1 schematically depicts the arrangement of the testing device 4 within the feed path of a document processing machine such as, for example, a bank note counting machine. The machine is provided with an intake roller 1 for withdrawing individual documents from a feed tray of the machine, a plurality of transport roller 2 imparting movement to documents within the machine, a document guide 3 and a testing device 4. The testing device 4 consists of a plurality of electrodes and sensors of the kind described supra which are mounted on a common support and which generate signals in response to different characteristics or parameters of a hologram for evaluation by evaluation circuitry (not shown).

It will be understood by those skilled in the art that the evaluation circuitry connected to the testing device 4 typically includes a memory for storing reference signals representative of the hologram of at least one genuine document. In the case of a bank note examining device, such memory may, however, well store reference signals of all denominations of bank notes in circulation in a given jurisdiction in order to allow the indiscriminate processing of unsorted batches of bank notes.

While as shown the apparatus provides for relative movement between the document and the sensors in one direction only, it will be appreciated that it is within the ambit of the present invention to bring about relative movement in orthogonal direction. Such orthogonal movement being of particular advantage in connection with the examination of holograms composed of a plurality of concentrically or eccentrically arranged annular segments.

FIG. 2*a* is a schematic sectional view of a hologram including a support layer or substrate 11 and a partially metallized layer 12 deposited thereon. Between the metallized parts 12 of the layer there is a plurality of interspersed demetallized segments 13. A voltage-time diagram of FIG. 2*b* clearly shows increased electrical conductivity in metallized segments 12 relative to the demetallized segments 13.

FIG. 3*a* depicts a schematic section of a hologram consisting of a substrate 11 and a discontinuous metallization layer 14. The discontinuous metallization layer 14 consists of segments 15, 16, 17, 18 and 19 of different electrical conductivities. The different conductivities are clearly shown in the voltage-time diagram of FIG. 3*b*. As shown, fully metallized segments of the hologram yield a higher conductivity than do the segments of lesser metallization.

FIG. 4*a* is a schematic sectional view of a hologram consisting of a substrate 11 and a discontinuous metallization layer 20. The discontinuous metallization layer 20 is provided with demetallized segments 21 as well as with additional authenticity elements. The additional authenticity elements may be optically effective ones. They may, for instance, be constituted by at least one dye 22 which is rendered visible of fluorescent in response to being irradiated by light of a predetermined wavelength, such as, for instance, ultra violet light. The fluorescent state of the dye 22 is detected by an optical sensor calibrated to respond to the specific fluorescence of the dye. FIG. 4*b* depicts the voltage-time diagram of the conductivity signal derived from the metallized segments of the hologram and FIG. 4*c* shows the voltage-time diagram of the signal derived from the optical sensor in response to the fluorescent dye 22.

The voltage-time diagrams shown in FIGS. 2*b*, 3*b*, 4*b* and 4*c* were derived from the cross-sectionally shown holograms shown in FIGS. 2*a*, 3*a* and 4 and integrated in documents fed through the machine schematically shown in FIG. 1.

The invention has been described in connection with optico-diffractive indicia provided on security documents. It will, however, be appreciated that the scope of the invention is not limited to the specific embodiments shown.

What is claimed is:

1. A device for testing the authenticity of a document provided with at least one optico-diffractively effective security indicium comprising a pattern of metallization of different electrical conductivities, comprising:

memory for storing a signal representative of said electrical conductivity of the security indicium of a genuine document;

structure for moving a document along a predetermined path;

structure for capacitively coupling a voltage to the security indicium;

structure for measuring the voltage in the security indicium and deriving therefrom a signal representative of the different electrical conductivities; and structure for comparing the derived signal against the stored signal wherein the optico-diffractively effective security indicium is a hologram comprising a plurality of discontinuous metallization segments with interspersed elements responsive to electromagnetic radiation of a frequency range.

2. A method of making device for testing the authenticity of a document provided with at least one optico-diffractively effective security indicium comprising a pattern of metallization of different electrical conductivities, said method comprising:

providing memory for storing a signal representative of said electrical conductivity of the security indicium of a genuine document;

providing structure for moving a document along a predetermined path;

providing structure for capacitively coupling a voltage to the security indicium;

providing structure for measuring the voltage in the security indicium and deriving therefrom a signal representative of the different electrical conductivities; and providing structure for comparing the derived signal against the stored signal wherein the optico-diffractively effective security indicium is a hologram comprising a plurality of discontinuous metallization segments with interspersed elements responsive to electromagnetic radiation of a frequency range.

* * * * *